United States Patent
Abadeer et al.

(10) Patent No.: US 7,763,531 B2
(45) Date of Patent: Jul. 27, 2010

(54) METHOD AND STRUCTURE TO PROCESS THICK AND THIN FINS AND VARIABLE FIN TO FIN SPACING

(75) Inventors: Wagdi W. Abadeer, Jericho, VT (US); Jeffrey S. Brown, Middlesex, VT (US); Kiran V. Chatty, Williston, VT (US); Robert J. Gauthier, Jr., Hinesburg, VT (US); Jed H. Rankin, South Burlington, VT (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/846,544

(22) Filed: Aug. 29, 2007

(65) Prior Publication Data
US 2007/0292996 A1   Dec. 20, 2007

Related U.S. Application Data

(62) Division of application No. 11/306,827, filed on Jan. 12, 2006, now Pat. No. 7,301,210.

(51) Int. Cl.
*H01L 21/425* (2006.01)

(52) U.S. Cl. .............................. 438/532; 257/E29.264; 257/E29.275; 257/E29.319; 257/E21.421

(58) Field of Classification Search ................ 438/65, 438/157, 283, 423; 257/E29.264, E29.275, 257/E29.319, E21.421
See application file for complete search history.

(56) References Cited

U.S. PATENT DOCUMENTS 4,650,744 A    3/1987   Amano 6,812,119 B1   11/2004  Ahmed et al.

(Continued)

FOREIGN PATENT DOCUMENTS

JP           64-57729          3/1989

(Continued)

OTHER PUBLICATIONS

Abadeer et al., U.S. Appl. No. 11/838,934, Office Action Communication, Mar. 20, 2009, 8 pages.

(Continued)

*Primary Examiner*—Hsien-ming Lee
*Assistant Examiner*—Kevin Parendo
(74) *Attorney, Agent, or Firm*—Gibb I.P. Law Firm, LLC

(57) ABSTRACT

The disclosure describes an integrated circuit with multiple semiconductor fins having different widths and variable spacing on the same substrate. The method of forming the circuit incorporates a sidewall image transfer process using different types of mandrels. Fin thickness and fin-to-fin spacing are controlled by an oxidation process used to form oxide sidewalls on the mandrels, and more particularly, by the processing time and the use of intrinsic, oxidation-enhancing and/or oxidation-inhibiting mandrels. Fin thickness is also controlled by using sidewalls spacers combined with or instead of the oxide sidewalls. Specifically, images of the oxide sidewalls alone, images of sidewall spacers alone, and/or combined images of sidewall spacers and oxide sidewalls are transferred into a semiconductor layer to form the fins. The fins with different thicknesses and variable spacing can be used to form a single multiple-fin FETs.

19 Claims, 10 Drawing Sheets

U.S. PATENT DOCUMENTS

| | | | |
|---|---|---|---|
| 6,872,647 B1 * | 3/2005 | Yu et al. | 438/585 |
| 6,875,703 B1 * | 4/2005 | Furukawa et al. | 438/736 |
| 6,987,289 B2 | 1/2006 | Nowak | |
| 7,037,790 B2 | 5/2006 | Chang et al. | |
| 7,208,815 B2 | 4/2007 | Chen et al. | |
| 7,214,991 B2 | 5/2007 | Yeo et al. | |
| 7,390,746 B2 * | 6/2008 | Bai et al. | 438/689 |
| 2003/0121145 A1 | 7/2003 | Reinberg | |
| 2004/0183161 A1 | 9/2004 | Reinberg | |
| 2004/0198063 A1 | 10/2004 | Subramanian et al. | |
| 2005/0001273 A1 | 1/2005 | Bryant et al. | |
| 2005/0017240 A1 | 1/2005 | Fazan | |
| 2005/0040444 A1 | 2/2005 | Cohen | |
| 2005/0056888 A1 | 3/2005 | Youn et al. | |
| 2005/0153562 A1 * | 7/2005 | Furukawa et al. | 438/694 |
| 2005/0161739 A1 | 7/2005 | Anderson et al. | |
| 2005/0167750 A1 | 8/2005 | Yang et al. | |
| 2005/0205932 A1 | 9/2005 | Cohen | |
| 2005/0213373 A1 | 9/2005 | Eldridge et al. | |
| 2005/0242406 A1 | 11/2005 | Hareland et al. | |
| 2005/0263801 A1 | 12/2005 | Park et al. | |
| 2006/0054978 A1 | 3/2006 | Clark, Jr. et al. | |
| 2006/0115978 A1 * | 6/2006 | Specht et al. | 438/637 |
| 2006/0267111 A1 | 11/2006 | Anderson et al. | |
| 2007/0054422 A1 | 3/2007 | Lerner | |
| 2007/0063276 A1 * | 3/2007 | Beintner et al. | 257/347 |
| 2007/0065990 A1 * | 3/2007 | Degroote et al. | 438/142 |
| 2007/0077743 A1 | 4/2007 | Rao et al. | |
| 2007/0080409 A1 | 4/2007 | Seliskar | |
| 2007/0108528 A1 | 5/2007 | Anderson et al. | |
| 2007/0158722 A1 | 7/2007 | Forbes | |

OTHER PUBLICATIONS

Abadeer et al., U.S. Appl. No. 11/838,934, Notice of Allowance, Jul. 24, 2009, 4 pages.

* cited by examiner

US 7,763,531 B2

METHOD AND STRUCTURE TO PROCESS THICK AND THIN FINS AND VARIABLE FIN TO FIN SPACING

CROSS-REFERENCE TO RELATED APPLICATIONS

This application is a divisional of U.S. application Ser. No. 11/306,827 filed Jan. 12, 2006, now U.S. Pat. No. 7,301,210 which is fully incorporated herein by reference.

BACKGROUND OF THE INVENTION

1. Field of the Invention

The invention generally relates to integrated circuit structures, and more particularly, to an integrated circuit structure comprising multiple non-planar semiconductor bodies with different thicknesses and with variable spacing between the semiconductor bodies.

2. Description of the Related Art

Integrated circuit design decisions are often driven by device scalability and manufacturing efficiency. For example, multi-gated non-planar field effect transistors (FETs), such as double gate or tri-gate FETs, were developed to provide scaled devices with larger drive currents and reduced short channel effects over planar FETs. Double gate FETs (e.g., fin-type FETs (finFETs) are non-planar transistors in which a channel is formed in a center region of a thin semiconductor fin with source and drain regions at opposing ends. Gates are formed on the opposing sides of the thin semiconductor body adjacent the channel. The effective fin width is determined by height (e.g., short wide fins can cause partial depletion of a channel). For a double-gated fin-FET the fin thickness is generally one-fourth the length of the gate or less to ensure suppression of deleterious short-channel effects, such as variability in threshold voltage and excessive drain leakage currents. Additionally, the effective channel width of a finFET device can be increased by using multiple fins.

Trigate MOSFETs have a similar structure to that of finFETs; however, the semiconductor fin width and height are approximately the same (e.g., the fin width can be approximately ½ to two times the height) so that gates can be formed on three sides of the channel, including the top surface and the opposing sidewalls. As long as the height of the channel is generally not less than the width, the channel will remain fully depleted and the three-dimensional field effects of a trigate MOSFET will give greater drive current and improved short-channel characteristics over a planar transistor. As with finFETs, the effective channel width of a trigate MOSFET can be increased by using multiple fins.

Current technology allows an integrated circuit structure to be designed and formed with multiple non-planar devices (e.g., finFETs or trigate FETs) on the same silicon-on-insulator (SOI) wafer but generally limits such structures to devices having the same fin width and to devices having approximately uniform spacing between the fins. However, there are a variety of applications that could benefit from an integrated circuit structure that has multiple fins with different thicknesses and that further has variable spacing between the fins. For example, different fin widths could be used to control depletion of different FETs in an integrated circuit or could be used in diffusion resistors. Additionally, variable fin to fin spacing could be incorporated into a fin to fin capacitor or into a precision resistor. Therefore, there is a need for a integrated circuit structure that has multiple semiconductor fins on the same substrate with different fin thicknesses and with variable spacing between the fins.

SUMMARY OF THE INVENTION

In view of the foregoing, an embodiment of the invention provides an integrated circuit structure comprising a plurality of semiconductor fins (e.g., silicon or silicon germanium fins) with different thicknesses and variable spacing on a substrate.

More particularly, an embodiment of the integrated circuit comprises a pair of first semiconductor fins and a pair of second semiconductor fins on the same substrate (e.g., an oxide layer). The second semiconductor fins are wider than the first semiconductor fins (i.e., the second semiconductor fins each have a second width that is greater than a first width of the first semiconductor fins). Additionally, the spacing between the pair of first semiconductor fins and the pair of second semiconductor fins is variable. Specifically, the spacing between the semiconductor fins is a function of the width of the fins such that the spacing between narrower fins is greater than the spacing between wider fins. Thus, the spacing between the first semiconductor fins is greater than the spacing between the wider second semiconductor fins. Due to the method of forming the pair of second semiconductor fins (described below), the spacing between the second semiconductor fins can be less than current state of the art minimum lithographic dimensions.

The integrated circuit can also comprise a pair of third semiconductor fins that are wider than the second semiconductor fins (i.e., the third semiconductor fins each have a third width that is greater than the second width of the second semiconductor fins). Thus, the spacing between the second semiconductor fins is greater than the spacing between the wider third semiconductor fins. Due to the method of forming the pair of third semiconductor fins (described below), the spacing between the third semiconductor fins can be less than current state of the art minimum lithographic dimensions.

The integrated circuit can also comprise a pair of fourth semiconductor fins that are narrower the second semiconductor fins but wider than the first semiconductor fins (i.e., the fourth semiconductor fins each have a fourth width that is less than the second width and greater than the first width). Thus, the spacing between the fourth semiconductor fins is greater than the spacing between the wider second semiconductor fins, but less than the spacing between the narrower first semiconductor fins. Due to the method of forming the pair of fourth semiconductor fins (described below), the spacing between the fourth semiconductor fins can be less than current state of the art minimum lithographic dimensions.

The semiconductor fins, formed on the same substrate and having different widths and variable spacing, can be used to in a variety of applications. Semiconductor fins with different thicknesses can be incorporated into diffusion resistors. Additionally, they may be used to control a FET (e.g., an n-FET or p-FET) to be a fully depleted or a partially depleted device. Variable fin-to-fin spacing can be incorporated into a fin-to-fin capacitor. Additionally, such variable fin-to-fin spacing can be incorporated into a precision resistor by depositing polysilicon or TaN between fins for accurate width control. Specifically, the semiconductor fins with different widths and variable spacing can be used to form a single non-planar multiple-fin field effect transistor (e.g., a single multi-fin finFET or a trigate FET). Alternatively, the semiconductor fins with different widths and spacing can be used to form multiple non-planar field effect transistors on the same substrate such that each FET comprises at least one of the semiconductor fins. For example, the plurality of semiconductor fins can be used to form various single-fin and/or multiple-fin finFETs and/or trigate FETs on the same substrate.

Embodiments of the method of fabricating an integrated circuit structure, as described above, incorporate the use of a novel sidewall image transfer process to transfer to form the semiconductor fins with different thicknesses and variable spacing on the same substrate. Specifically, embodiments of the method of fabricating the integrated circuit structure comprise providing a substrate with a semiconductor layer (e.g., a silicon-on-insulator (SOI) wafer) and forming one or more etch-stops (e.g., a pad oxide layer and a pad nitride layer) on the semiconductor layer. A polysilicon layer can be formed on the etch stop layers and an additional etch stop layer (e.g., a nitride cap layer) can be formed on the polysilicon layer.

Optionally, once the polysilicon layer is formed, an oxidation-enhancing portion (e.g., boron-doped portion) and/or an oxidation-inhibiting portion (e.g., a nitrogen-doped portion) of the polysilicon layer can be formed.

The method can further comprise forming at least two different polysilicon mandrels in the polysilicon layer. For example, a first and second mandrels (which will can be differentiated during subsequent processing) can be formed in non-doped polysilicon regions of the polysilicon layer, a third mandrel can be formed in a boron-doped portion of the polysilicon layer and/or a fourth mandrel can be formed in a nitrogen-doped portion of the polysilicon layer.

Once the mandrels are formed, an oxidation process can be performed such that pairs of oxide sidewalls are formed on some or all of the mandrels (e.g., on the second, third and fourth mandrels). Optionally, a mask can be patterned over one or more of the mandrels (e.g., the first mandrel) to prevent the formation of oxide sidewalls during the oxidation process. The resulting pairs of oxide sidewalls will vary in thickness due to the oxidation capability of the underlying polysilicon. Consequently, the spacing between pairs of oxide sidewall on each mandrel will also vary. Specifically, a pair of oxide sidewalls on a boron-doped polysilicon mandrel (e.g., the third mandrel) will be thicker and closer together than a pair of oxide sidewalls on a non-doped polysilicon mandrel (e.g., the second mandrel). Additionally, a pair of oxide sidewalls of a non-doped polysilicon mandrel will be thicker, and closer together than a pair of oxide sidewalls on a nitrogen-doped polysilicon mandrel (e.g., the fourth mandrel).

In one embodiment of the method, at this point in the process, the mandrels can be selectively removed such that the pairs of oxide sidewalls remain on the substrate. Then, images of the pairs of oxide sidewalls are transferred into a semiconductor layer of the wafer to form pairs of semiconductor fins. Note that in this embodiment, masking of polysilicon mandrels (e.g., the first mandrel) prior to the oxidation process is superfluous. Also note that in this embodiment to ensure that semiconductor fins with different thicknesses and variable fin-to-fin spacing are formed on the same substrate two or more of the following different types of polysilicon mandrels must be formed: a non-doped polysilicon mandrel (i.e., the second mandrel), a boron-doped polysilicon mandrel (i.e., the third mandrel), and/or a nitrogen-doped polysilicon mandrel (i.e., the fourth mandrel). Due to the different thicknesses of the oxide sidewalls and the varying spaces between pairs of oxide sidewalls, the semiconductor fins are formed with different widths and variable fin-to-fin spacing. Specifically, if all three of the above-mentioned types of mandrels are formed in the polysilicon layer, then three pairs of semiconductor fins with three different widths and three different fin-to-fin spacings will be formed in the silicon layer.

In another embodiment of the method, after completing the oxidation process, sidewall spacers can be simultaneously formed adjacent to the sidewalls of each mandrel. Note that in this embodiment to ensure that semiconductor fins with different thicknesses and variable fin-to-fin spacing are formed on the same substrate two or more of the following types of polysilicon mandrels must be formed: a polysilicon mandrel without oxide sidewalls (i.e., a first mandrel), a non-doped polysilicon mandrel with oxide sidewalls (i.e., a second mandrel), a boron-doped polysilicon mandrel with oxide sidewalls (i.e., a third mandrel), and/or a nitrogen-doped polysilicon mandrel with oxide sidewalls (i.e., a fourth mandrel). Thus, first sidewall spacers can be formed adjacent to the polysilicon sidewalls of the first mandrel, second sidewall spacers can are formed adjacent to the oxide sidewalls of the second mandrel, third sidewall spacers can be formed adjacent to the oxide sidewalls of the third mandrel, and/or fourth sidewall spacers can be formed adjacent to the oxide sidewalls of the fourth mandrel.

After the formation of the sidewall spacers, the mandrels can be selectively removed such that the sidewall spacers and the oxide sidewalls remain on the substrate.

Then, images of sidewall spacers without adjacent oxide sidewalls (e.g., the first sidewall spacers that were formed adjacent to the polysilicon on the first mandrel) are transferred into a semiconductor layer of the wafer to form a pair of first semiconductor fins. Simultaneously, combined images of sidewall spacers with adjacent oxide sidewalls are transferred into the semiconductor layer of the wafer to form additional pairs of semiconductor fins (e.g., the combined images of the second sidewall spacers with the adjacent oxide sidewalls that were formed on the second mandrel are transferred into the silicon layer to form the second semiconductor fin, etc.).

Due to the varying thicknesses of the oxide sidewalls (or the absence thereof) and the varying spacing between pairs of oxide sidewalls, the semiconductor fins are formed with different widths and variable fin-to-fin spacing. Thus, if all four-types of mandrels (e.g., a polysilicon mandrel without oxide sidewalls (i.e., a first mandrel), a non-doped polysilicon mandrel with oxide sidewalls (i.e., a second mandrel), a boron-doped polysilicon mandrel with oxide sidewalls (i.e., a third mandrel), and a nitrogen-doped polysilicon mandrel with oxide sidewalls (i.e., a fourth mandrel)) are formed in the polysilicon layer, then four pairs of semiconductor fins with four different widths and four different fin-to-fin spacings can be formed in the silicon layer. Specifically, a pair of first fins (e.g., first fins that were formed by transferring an image of a pair of first sidewall spacers into the semiconductor layer) will have a first width that is thinner than any of the other fins and will also a fin-to-fin spacing that is greater than that of any of the other fins because of the absence of oxide sidewalls on the first mandrel. A pair of second fins (e.g., second fins that were formed by transferring a combined image of a pair of second sidewall spacers and oxide sidewalls formed on a non-doped polysilicon mandrel) will be thicker, and thus, have less fin-to-fin spacing, that the first fins. A pair of third fins (e.g., third fins that were formed by transferring a combined image of a pair of third sidewall spacers and oxide sidewalls formed on a boron-doped polysilicon mandrel) will be thicker, and thus, have less fin-to-fin spacing, that the second fins. Lastly, a pair of fourth fins (e.g., fourth fins that were formed by transferring a combined image of a pair of fourth sidewall spacers and oxide sidewalls formed on a nitrogent-doped polysilicon mandrel) will be thicker, and thus, have less fin-to-fin spacing than the first fins, but will be thinner, and thus, have greater fin-to-fin spacing than the second fins.

These and other aspects of embodiments of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the embodiments of the invention without departing from the spirit thereof, and the invention includes all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS OF THE INVENTION

Figure 1:
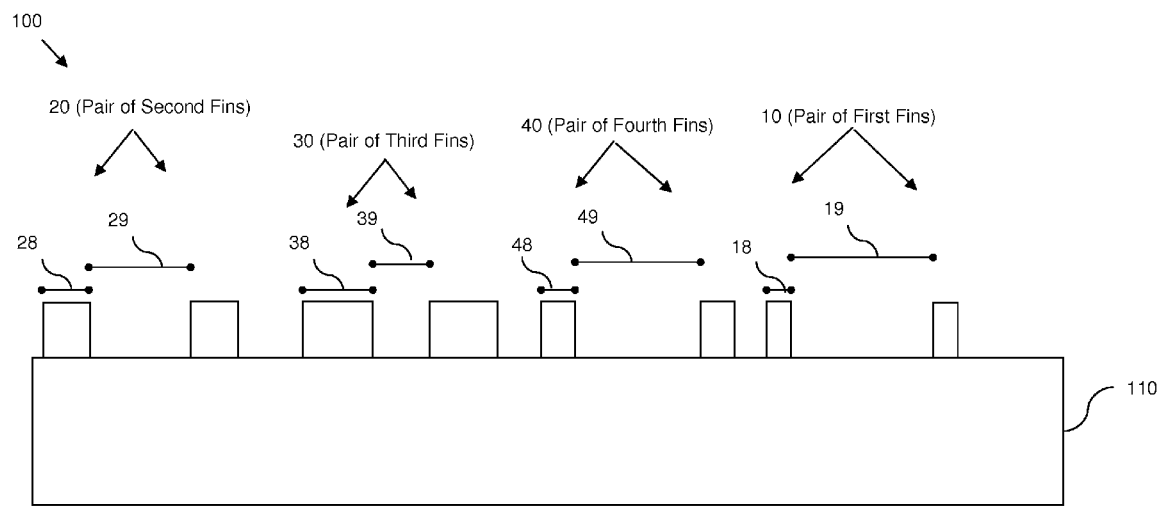
FIG. 1 is schematic diagram illustrating an embodiment of an integrated circuit structure of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the invention.

As mentioned above, current technology allows an integrated circuit structure to be designed and formed with multiple non-planar devices (e.g., finFETs or trigate FETs) on the same silicon-on-insulator (SOI) wafer but generally limits such structures to devices having the same fin width and to devices having uniform spacing between the fins. However, there are a variety of applications that could benefit from an integrated circuit structure that has multiple fins with different thicknesses and that further has variable spacing between the fins. Therefore, disclosed herein are embodiments of an integrated circuit structure that comprises a plurality of semiconductor fins (e.g., silicon or silicon germanium fins) with different thicknesses and variable fin-to-fin spacing on the same substrate. Also, disclosed herein is an associated method of forming the structure.

More particularly, referring to FIG. 1, an embodiment of the integrated circuit 100 comprises at least one (e.g., a pair) of first semiconductor fins 10 and at least one (e.g., a pair) of second semiconductor fins 20 on the same substrate 110 (e.g., an oxide layer). The second semiconductor fins 20 are wider than the first semiconductor fins 10 (i.e., the second semiconductor fins 20 each have a second width 28 that is greater than a first width 18 of the first semiconductor fins 10). Additionally, the spacing between the pair of first semiconductor fins 10 and the pair of second semiconductor fins 20 is variable. Specifically, the spacing between each pair of semiconductor fins is a function of the width of the fins such that the spacing between narrower fins is greater than the spacing between wider fins. Thus, the spacing 19 between the first semiconductor fins 10 is greater than the spacing 29 between the wider second semiconductor fins 20. Due to the various processes used to form the pair of second semiconductor fins 20 (described below), the spacing 29 between the second semiconductor fins 20 can be less than current state of the art minimum lithographic dimensions.

The integrated circuit 100 can also comprise at least one (e.g., a pair) of third semiconductor fins 30 that are wider than the second semiconductor fins 20 (i.e., the third semiconductor fins 30 each have a third width 38 that is greater than the second width 28 of the second semiconductor fins 20). Thus, the spacing 29 between the second semiconductor fins 20 is greater than the spacing 39 between the wider third semiconductor fins 30. Due to the various processes used to form the pair of third semiconductor fins 30 (described below), the spacing 39 between the third semiconductor fins 30 can be less than current state of the art minimum lithographic dimensions.

The integrated circuit 100 can also comprise a pair of fourth semiconductor fins 40 that are narrower the second semiconductor fins 20 but wider than the first semiconductor fins 10 (i.e., the fourth semiconductor fins 40 each have a fourth width 48 that is less than the second width 28 and greater than the first width 18). Thus, the spacing 49 between the fourth semiconductor fins 40 is greater than the spacing 29 between the wider second semiconductor fins 20, but less than the spacing 19 between the narrower first semiconductor fins 10. Due to the various processes used to form the pair of fourth semiconductor fins 40 (described below), the spacing 49 between the fourth semiconductor fins 40 can be less than current state of the art minimum lithographic dimensions.

Figure 2:
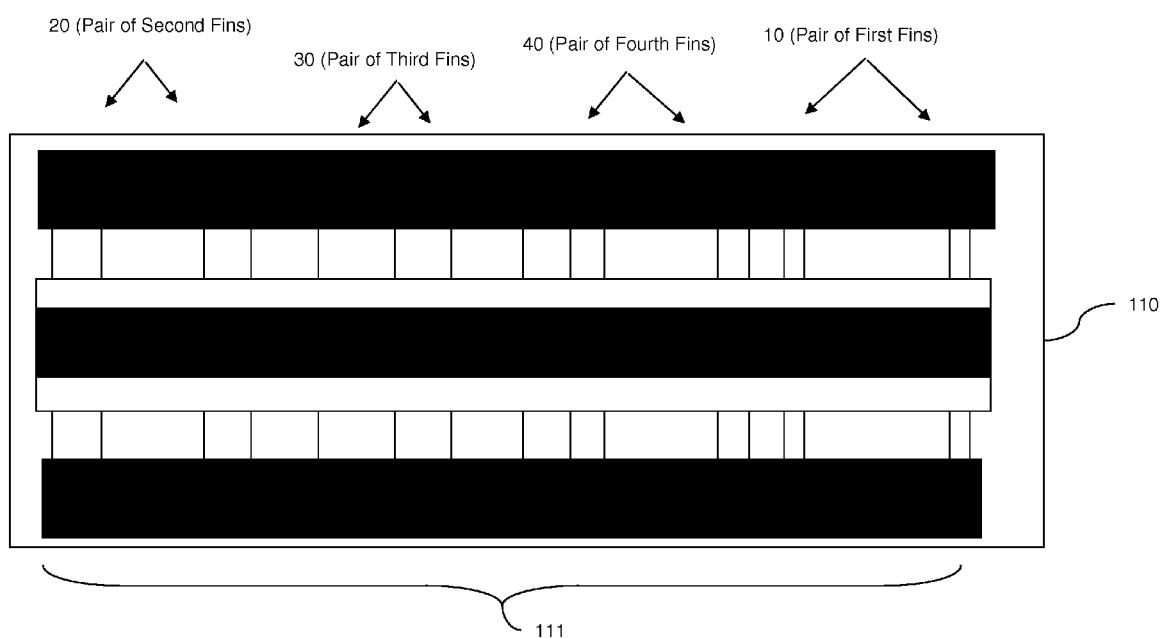
FIGS. 2-3 are schematic diagrams illustrating exemplary implementations of the integrated circuit structure of the invention.
Figure 3:
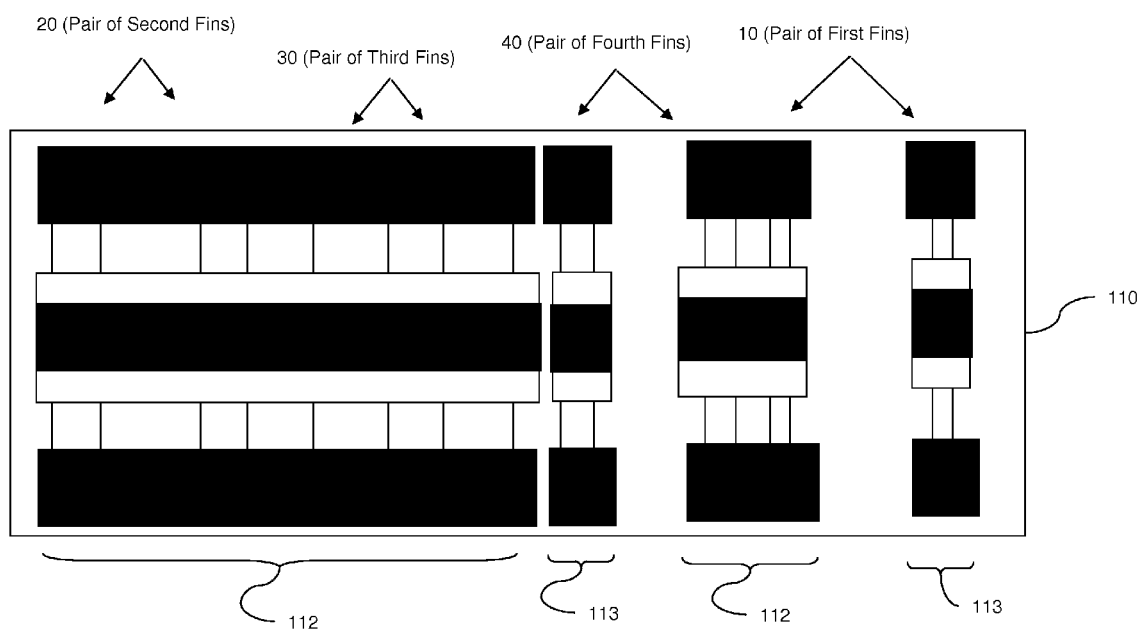

The semiconductor fins (e.g., fins 10, 20, 30 and/or 40), formed on the same substrate and having different widths and variable spacing, can be used to in a variety of applications. Semiconductor fins with different thicknesses can be incorporated into diffusion resistors. Additionally, they may be used to control FET depletion. For example, fin width in an n-FET or p-FET can be used to establish a fully depleted or a partially depleted device. Variable fin-to-fin spacing can be incorporated into a fin-to-fin capacitor. Additionally, such variable fin-to-fin spacing can be incorporated into a precision resistor by depositing polysilicon or TaN between fins for accurate width control. Specifically, referring to FIG. 2, the semiconductor fins 10-40 with different widths and variable spacing can be used to form a single non-planar multiple-fin field effect transistor 111 (e.g., a single multi-fin finFET or a trigate FET). Alternatively, referring to FIG. 3, the semiconductor fins 10-40 with different widths and spacing can be used to form multiple non-planar field effect transistors 112-113 on the same substrate such that each FET comprises at least one of the semiconductor fins. For example, the plurality of semiconductor fins 10-40 can be used to form various single-fin 113 and/or multiple-fin 112 finFETs and/or trigate FETs on the same substrate 110.

Figure 4:
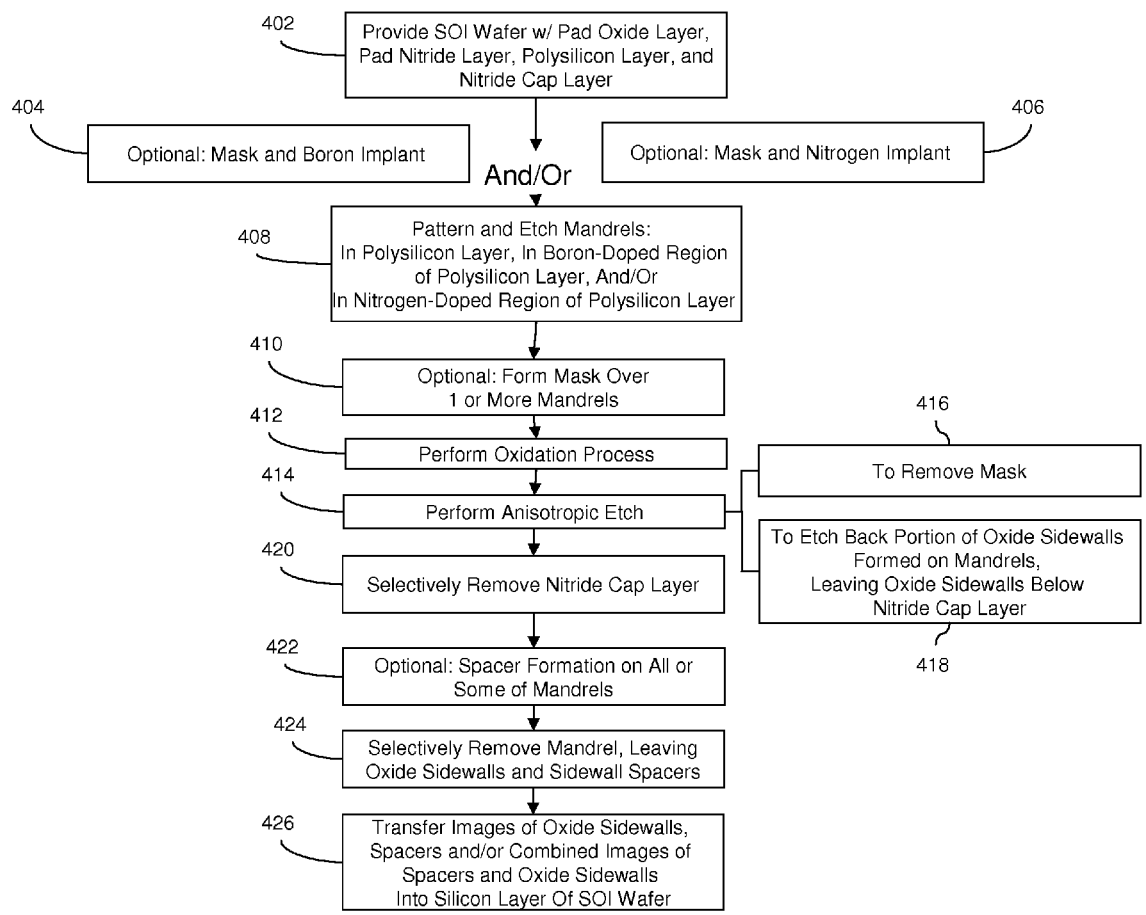
FIG. 4 is a schematic flow diagram illustrating an embodiment of a method of the forming the integrated circuit structure of the invention.
Figure 5:
FIG. 5 is a schematic diagram illustrating a partially completed integrated circuit structure of the invention.

Referring to FIG. 4, embodiments of the method of fabricating an integrated circuit structure, as described above, incorporate the use of a novel sidewall image transfer process to transfer to form the semiconductor fins with different thicknesses and variable spacing on the same substrate. Specifically, embodiments of the method of fabricating the integrated circuit structure of the invention comprise providing a wafer 105 with a semiconductor layer 120 (e.g., a silicon layer, a silicon germanium layer, etc.) on an insulator layer 110 (e.g., a silicon-on-insulator (SOI) wafer) and forming one or more etch-stop layers (e.g., a pad oxide layer 130 and a pad nitride layer 140) on the semiconductor layer 120. A polysilicon layer 150 can be formed on the etch stop layers and an additional etch stop layer (e.g., a nitride cap layer 160) can be formed on the polysilicon layer 150. To facilitate subsequent processing steps, the nitride cap layer 160 should be formed thinner than the pad nitride layer 140 (402; see FIG. 5).

Figure 6:
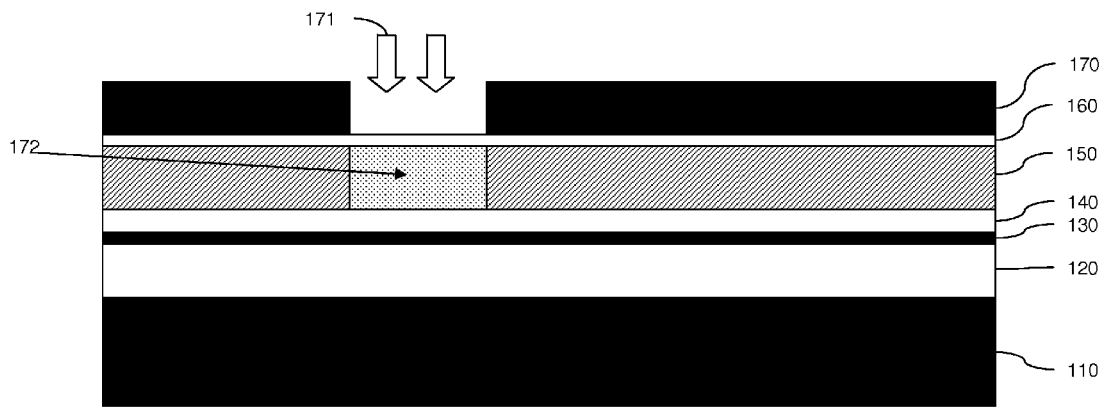
FIG. 6 is a schematic diagram illustrating a partially completed integrated circuit structure of the invention.
Figure 7:
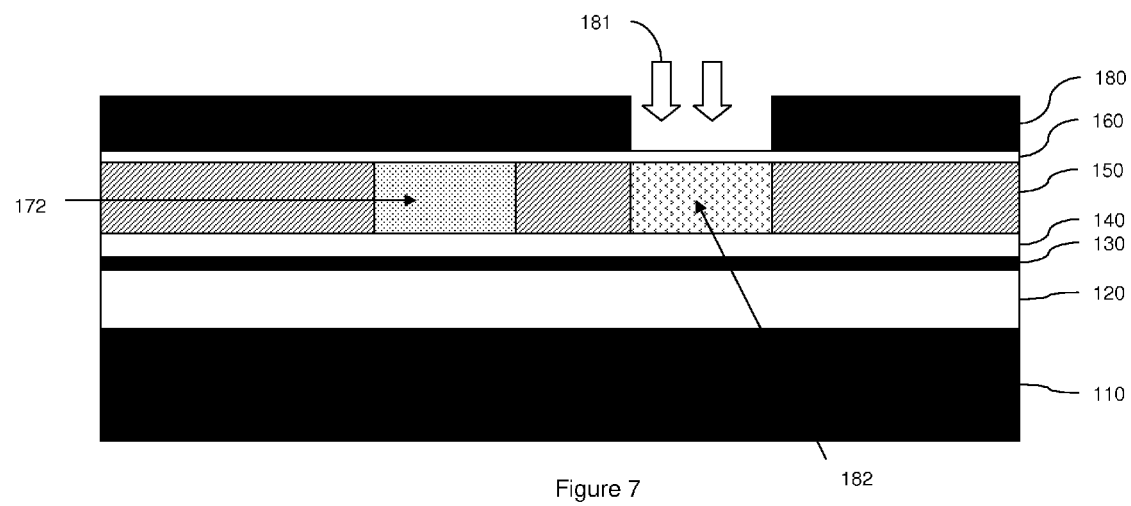
FIG. 7 is a schematic diagram illustrating a partially completed integrated circuit structure of the invention.

Optionally, once the polysilicon layer 150 is formed (at process 402), an oxidation-enhancing portion and/or an oxidation-inhibiting portion of the polysilicon layer can be formed (404-406). An oxidation-enhancing portion 172 of the polysilicon layer 150 can be formed by patterning a mask 170 above the polysilicon layer 150 and implanting an unprotected area of the polysilicon layer 150 with a material 171 that increases the oxidation rate of polysilicon (e.g., boron, $B_{11}$) (see FIG. 6). Similarly, an oxidation-inhibiting portion 182 of the polysilicon layer 150 can be formed by patterning a mask 180 above the polysilicon layer 150 and implanting an unprotected area of the polysilicon layer 150 with a material 181 that decreases the oxidation rate of polysilicon (e.g., nitrogen, $N_2$) (see FIG. 7). Implant concentrations can be controlled to effect the oxidation-enhancing or oxidation-inhibiting capabilities of the polysilicon.

Figure 8:
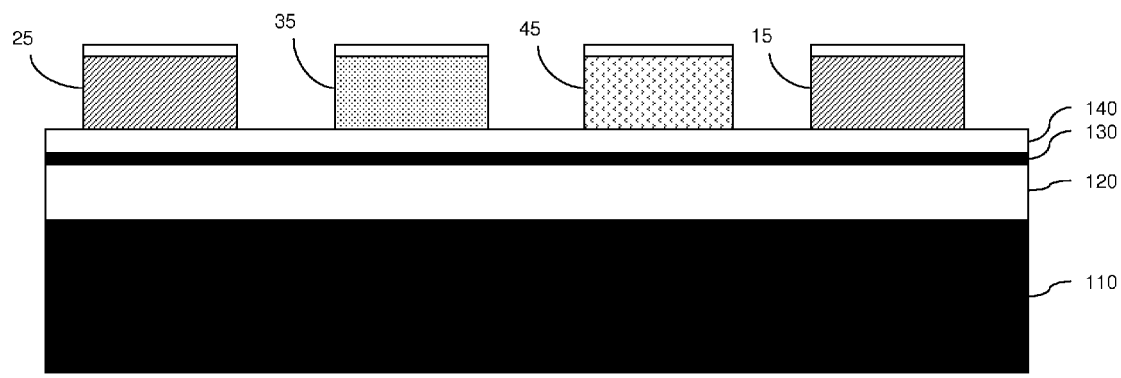
FIG. 8 is a schematic diagram illustrating a partially completed integrated circuit structure of the invention.

The method can further comprise forming polysilicon mandrels in the polysilicon layer, for example, by lithographic patterning (408; see FIG. 8). For example, a first mandrel 15 and a second mandrel 25 can be formed in non-doped polysilicon regions of the polysilicon layer 150. Additionally, a third mandrel 35 and/or a fourth mandrel 45 can be formed in a boron-doped area 172 and a nitrogen-doped area 182, respectively, of the polysilicon layer. At least two different mandrels must be formed in order to form semiconductor fins with different widths and variable fin-to-fin spacing (see detailed discussion below). Each mandrel can be patterned and etched to current state of the art minimum lithographic dimensions.

Figure 9:
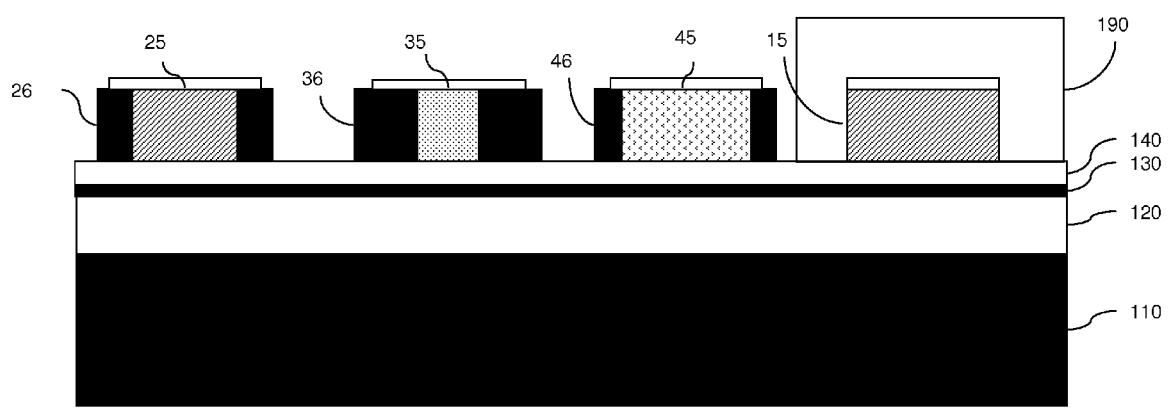
FIG. 9 is a schematic diagram illustrating a partially completed integrated circuit structure of the invention.

Once the mandrels (e.g., mandrels 15, 25, 35 and/or 45) are formed (at process 408) an oxidation process can be performed such that pairs of oxide sidewalls are formed on some or all of the mandrels (e.g., sidewalls 26 on the second mandrel 25, sidewalls 36 on the third mandrel 35 and sidewalls 46 on the fourth 45 mandrels) (212; see FIG. 9). Optionally, a mask 190 (e.g., an oxide mask) can be patterned over one or more of the mandrels (e.g., the first mandrel 15) to prevent the formation of oxide sidewalls during the oxidation process (210). Preventing the oxidation of the sidewalls on the first mandrel 15 differentiates the first mandrel 15 from the second mandrel 25 so that fins 10 and 20 (see FIG. 1) with different widths and variable fin-to-fin spacing can be formed on the same substrate without requiring the use of boron or nitrogen-doping of the polysilicon layer 150 (see detailed discussion below). Ultimately fin-to-fin spacing and fin thickness can be controlled depending up the polysilicon oxidation time.

Figure 10:
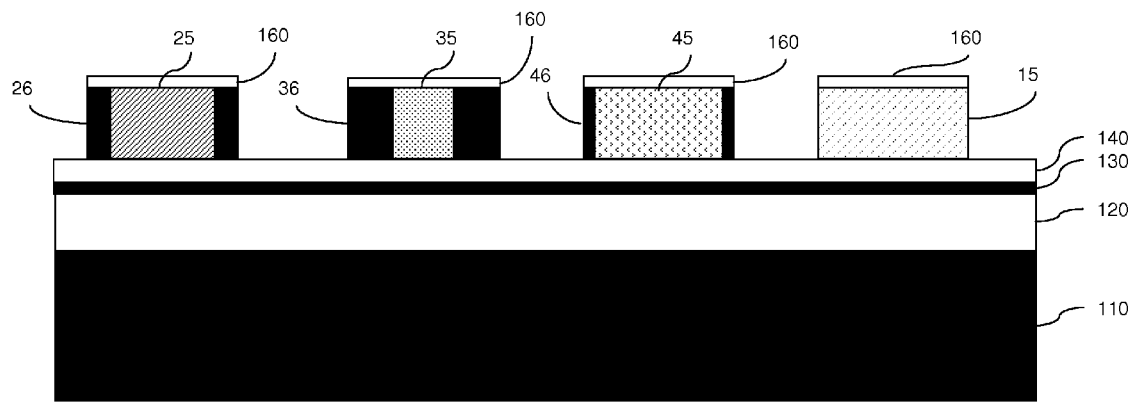
FIG. 10 is a schematic diagram illustrating a partially completed integrated circuit structure of the invention.
Figure 11:
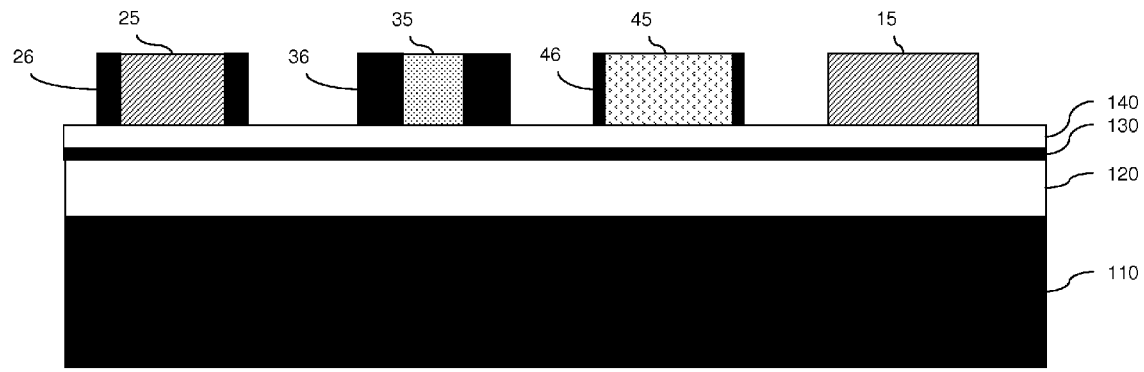
FIG. 11 is a schematic diagram illustrating a partially completed integrated circuit structure of the invention.

After the oxidation process 212 is completed, an anisotropic etch process can be performed to selectively remove oxide masks and to etch back oxide extending outward below the nitride cap layer 160 on each of the mandrels (e.g., the second 25, third 35 and/or fourth 45 mandrels) (214-218; see FIG. 10). The nitride cap 160 can also be removed (220; see FIG. 11). Removal of the nitride cap layer 160 can be accomplished, for example, using a selective etching process. The process should be performed such that a portion of the thicker pad nitride layer 140 remains. The resulting pairs of oxide sidewalls 26, 36, and 46 will vary in thickness due to oxidation capability of the underlying polysilicon. Thus, the spacing between pairs of oxide sidewalls on each mandrel 25, 35, and 45 will also vary. Specifically, a pair of oxide sidewalls 36 on a boron-doped polysilicon mandrel 35 (e.g., the third mandrel) will be thicker and, thus, closer together, than a pair of oxide sidewalls 26 on a non-doped polysilicon mandrel 25 (e.g., the second mandrel). Additionally, a pair of oxide sidewalls 26 of a non-doped polysilicon mandrel 25 will be thicker, and thus, closer together, than a pair of oxide sidewalls 46 on a nitrogen-doped polysilicon mandrel 45 (e.g., the fourth mandrel).

Figure 12:
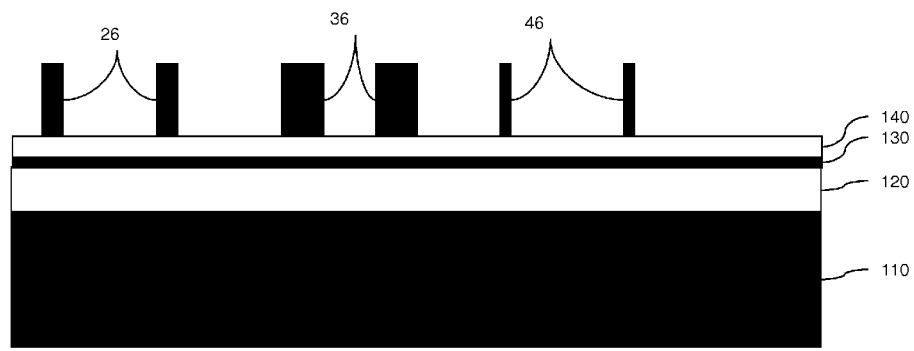
FIG. 12 is a schematic diagram illustrating a partially completed integrated circuit structure of the invention.
Figure 13:
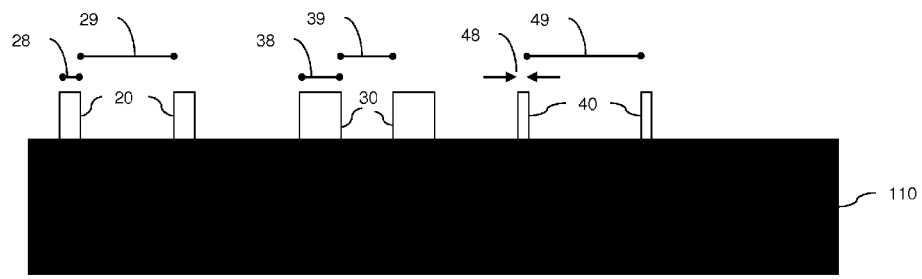
FIG. 13 is a schematic diagram illustrating a partially completed integrated circuit structure of the invention.

In one embodiment of the method, at this point in the process, the mandrels can be selectively removed such that the pairs of oxide sidewalls 26, 36, and 46 remain on the substrate (222; see FIG. 12). Then, images of the pairs of oxide sidewalls are transferred into a semiconductor layer 120 of the wafer 105 to form pairs of semiconductor fins with different thicknesses and variable fin-to-fin spacing (226; see FIG. 13). Note that in this embodiment, masking of polysilicon mandrels (e.g., the first mandrel 10 of FIG. 9) prior to the oxidation process is superfluous because the mandrel is removed and only the oxide sidewalls are used to form the semiconductor fins. Also note that in this embodiment to ensure that semiconductor fins with different thicknesses and variable fin-to-fin spacing are formed on the same substrate 110 at least two different mandrels of the following types must be formed: a non-doped polysilicon mandrel with oxide sidewalls (i.e., the second mandrel 25), a boron-doped polysilicon mandrel with oxide sidewalls (i.e., the third mandrel 35), and/or a nitrogen-doped polysilicon mandrel with oxide sidewalls (i.e., the fourth mandrel 45). Thus, after the oxidation process, a pair of oxide sidewalls 26 from a second mandrel 25, a pair of oxide sidewalls 36 from a third mandrel 35, and/or a pair of oxide sidewalls 46 from a fourth mandrel 45 can be simultaneously transferred into the semiconductor layer to form pairs of second 20, third 30 and/or fourth 40 semiconductor fins, respectively.

Due to the different thicknesses of the oxide sidewalls 26, 36, and 46 and the varying spaces between pairs of oxide sidewalls, the semiconductor fins 20, 30, and 40 are formed with different widths and variable fin-to-fin spacing. Specifically, if all three-types of mandrels (i.e., a non-doped polysilicon mandrel with oxide sidewalls 25, a boron-doped polysilicon mandrel with oxide sidewalls 35, and a nitrogen-doped polysilicon mandrel with oxide sidewalls 45) are formed in the polysilicon layer, then three pairs of semiconductor fins 20, 30, and 40 with three different widths and three different fin-to-fin spacings can be formed in the silicon layer. Specifically, a pair of third fins will be formed thicker and closer together than a pair of second fins and the pair of second fins will be formed thicker and closer together than a pair of fourth fins.

Figure 14:
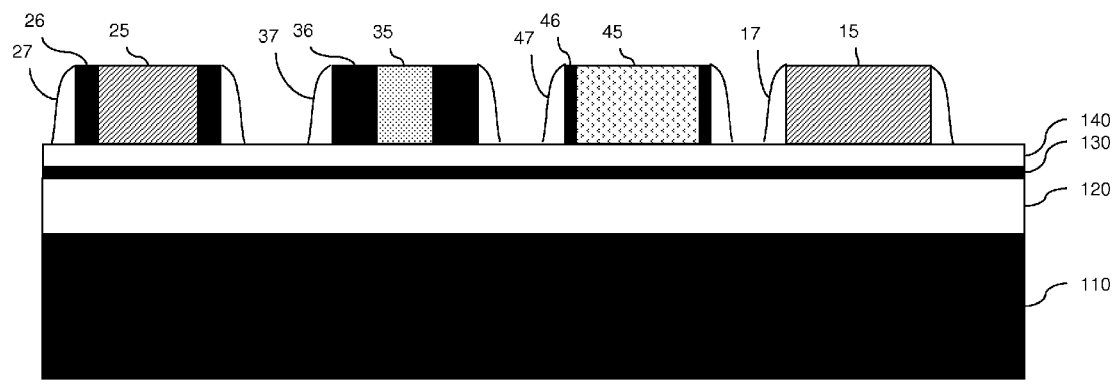
FIG. 14 is a schematic diagram illustrating an integrated circuit structure of the invention.

In another embodiment of the method, after completing the oxidation process (at process 412) and removing the nitride cap layer (at process 420), sidewall spacers can be simultaneously formed adjacent to the sidewalls of each mandrel (422; see FIG. 14). Note that in this embodiment to ensure that semiconductor fins with different thicknesses and variable fin-to-fin spacing are formed on the same substrate at least two different types of polysilicon mandrels must be formed (e.g., at least two of a polysilicon mandrel without oxide sidewalls (i.e., a first mandrel 15), a non-doped polysilicon mandrel with oxide sidewalls (i.e., a second mandrel 25), a boron-doped polysilicon mandrel with oxide sidewalls (i.e., a third mandrel 35), and/or a nitrogen-doped polysilicon mandrel with oxide sidewalls (i.e., a fourth mandrel 45). Thus, first sidewall spacers 17 can be formed adjacent to the polysilicon sidewalls of the first mandrel 15, second sidewall spacers 27 can are formed adjacent to the oxide sidewalls 26 of the second mandrel 25, third sidewall spacers 37 can be formed adjacent to the oxide sidewalls 36 of the third mandrel 35, and/or fourth sidewall spacers 47 can be formed adjacent to the oxide sidewalls 46 of the fourth mandrel 45.

Figure 15:
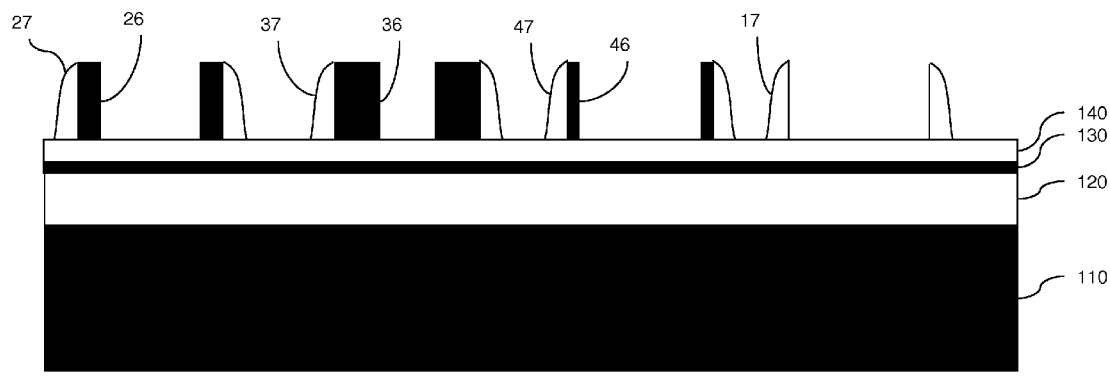
FIG. 15 is a schematic diagram illustrating a partially completed integrated circuit structure of the invention.

After the formation of the sidewall spacers (at process 422), the mandrels (e.g., mandrels 10-40) can be selectively removed such that the sidewall spacers (17-47) and the oxide sidewalls (26-46) remain on the substrate (424; see FIG. 15). Then, images of sidewall spacers 17 without adjacent oxide sidewalls (e.g., the first sidewall spacers 17 that were formed adjacent to the polysilicon on the first mandrel 15) are transferred into a semiconductor layer 120 of the wafer 105 to form a pair of first semiconductor fins 10.

Simultaneously, combined images of sidewall spacers with adjacent oxide sidewalls are transferred into the semiconductor layer 120 of the wafer to form additional pairs of semiconductor fins (e.g., the combined images of the second sidewall spacers 27 with the adjacent oxide sidewalls 26 that were formed on the second mandrel 20 are transferred into the silicon layer 120 to form the second semiconductor fins 20, the combined images of the third sidewall spacers 37 with the adjacent oxide sidewalls 36 that were formed on the third mandrel 30 are transferred into the silicon layer 120 to form the third semiconductor fins 30, etc.).

Due to the varying thicknesses of the oxide sidewalls 26-46 (or the absence thereof) and the varying spacing between pairs of oxide sidewalls, the semiconductor fins are formed with different widths and variable fin-to-fin spacing. Thus, if all four-types of mandrels (e.g., a polysilicon mandrel without oxide sidewalls (i.e., a first mandrel), a non-doped polysilicon mandrel with oxide sidewalls (i.e., a second mandrel), a boron-doped polysilicon mandrel with oxide sidewalls (i.e., a third mandrel), and a nitrogen-doped polysilicon mandrel with oxide sidewalls (i.e., a fourth mandrel)) are formed in the polysilicon layer, then four pairs of semiconductor fins with four different widths and four different fin-to-fin spacings can be formed in the silicon layer. Specifically, referring to FIG. 1, a pair of first fins 10 (e.g., first fins that were formed by transferring an image of a pair of first sidewall spacers into the semiconductor layer) will have a first width 18 that is thinner than any of the other fins and will also a fin-to-fin spacing 19 that is greater than that of any of the other fins because of the absence of oxide sidewalls on the first mandrel 15. A pair of second fins 20 (e.g., second fins that were formed by transferring a combined image of a pair of second sidewall spacers and oxide sidewalls formed on a non-doped polysilicon mandrel) will be thicker, and thus, have less fin-to-fin spacing, that the first fins 10. A pair of third fins 30 (e.g., third fins that were formed by transferring a combined image of a pair of third sidewall spacers and oxide sidewalls formed on a boron-doped polysilicon mandrel) will be thicker, and thus, have less fin-to-fin spacing, that the second fins 20. Lastly, a pair of fourth fins 40 (e.g., fourth fins that were formed by transferring a combined image of a pair of fourth sidewall spacers and oxide sidewalls formed on a nitrogent-doped polysilicon mandrel) will be thicker, and thus, have less fin-to-fin spacing than the first fins 10, but will be thinner, and thus, have greater fin-to-fin spacing than the second fins 20.

Therefore, disclosed above, is an integrated circuit structure with a plurality of semiconductor fins with different widths and variable spacing on the same substrate. Also, disclosed is a method for forming this integrated circuit structure that incorporates a sidewall image transfer process using different types of mandrels (e.g., a non-doped polysilicon mandrel without oxide sidewalls, a non-doped polysilicon mandrel with oxide sidewalls, a boron-doped polysilicon mandrel with oxide sidewalls, and/or a nitrogen-doped polysilicon mandrel with oxide sidewalls). Fin thickness and fin-to-fin spacing can be controlled by the oxidation process used to form oxide sidewalls on the mandrels, and more particularly, by the oxidation processing time and the use of intrinsic, oxidation-enhancing and/or oxidation-inhibiting polysilicon mandrels. The fin thickness can further by controlled by the use of sidewalls spacers combined with or instead of the oxide sidewalls. Specifically, images of the oxide sidewalls alone, images of sidewall spacers alone, and/or combined images of sidewall spacers and oxide sidewalls can be transferred into a semiconductor layer to form the fins. The semiconductor fins with different thicknesses and variable spacing can be used to form a single multiple-fin FET or, alternatively, the semiconductor fins can be used to form various single-fin and/or multiple-fin FETs.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of embodiments, those skilled in the art will recognize that the invention can be practiced with modification within the spirit and scope of the appended claims.

What is claimed is:

1. A method of fabricating an integrated circuit structure, said method comprising:

forming a polysilicon layer above a semiconductor layer;

performing an implant process in order to form at least one of an oxidation-enhancing portion and an oxidation-inhibiting portion of said polysilicon layer;

forming a plurality of mandrels in said polysilicon layer, said mandrels being approximately equal in size and comprising at least a first mandrel in said one of said oxidation-enhancing portion and said oxidation-inhibiting portion and a second mandrel not in said one of said oxidation-enhancing portion and said oxidation-inhibiting portion;

performing an oxidation process to form first oxide sidewalls on said first mandrel and second oxide sidewalls on said second mandrel, said first oxide sidewalls having a first width and being separated by a first distance and said second oxide sidewalls having a second width and being separated by a second distance, wherein as a result of said implant process and said oxidation process, said first width is different from said second width and said first distance is different from said second distance; and transferring, into said semiconductor layer, images of said first oxide sidewalls and said second oxide sidewalls to form a pair of first semiconductor fins and a pair of second semiconductor fins, respectively, each of said first semiconductor fins in said pair of first semiconductor fins having said first width and being separated by said first distance and each of said second semiconductor fins in said pair of second semiconductor fins having said second width and being separated by said second distance.

2. The method of claim 1, wherein said performing of said implant process comprises implanting a portion of said polysilicon layer with boron to form said oxidation-enhancing portion.

3. The method of claim 1, wherein said performing of said implant process comprises implanting a portion of said polysilicon layer with nitrogen to form said oxidation-inhibiting portion.

4. The method of claim 1, further comprising, before said transferring of said images, selectively removing said mandrels such that said first oxide sidewalls and said second oxide sidewalls remain above said semiconductor layer.

5. The method of claim 1, wherein
said forming of said plurality of mandrels in said polysilicon layer further comprises forming a third mandrel and said oxidation further comprises forming third oxide sidewalls on said third mandrel; and said method further comprises:
after said oxidation process, forming sidewall spacers on said third oxide sidewalls of said third mandrel;
selectively removing said third mandrel such that said third oxide sidewalls and said sidewall spacers remain above said semiconductor layer; and
transferring combined images of said sidewall spacers and said third oxide sidewalls into said semiconductor layer to form a pair of third semiconductor fins, each of said third semiconductor fins in said pair of said third semiconductor fins having a third width that is different from said first width and said second width.

6. The method of claim 1, further comprising, prior to said oxidation process, masking at least one of said mandrels to prevent formation of oxide sidewalls.

7. The method of claim 6, wherein said forming of said plurality of mandrels comprises forming at least four mandrels with at least one mandrel in each of said polysilicon layer, said oxidation-enhancing portion of said polysilicon layer, and said oxidation-inhibiting portion of said polysilicon layer and further forming sidewall spacers on at least one mandrel such that said method forms said pair of first semiconductor fins, said pair of second semiconductor fins, a pair of third semiconductor fins and a pair of fourth semiconductor fins, wherein each of said third semiconductor fins in said pair of said third semiconductor fins have a third width different from said first width and said second width and are separated by a third distance that is different from said first distance and said second distance and wherein each of said fourth semiconductor fins in said pair of said fourth semiconductor fins have a fourth width different from said first width, said second width and said third width and are separated by a fourth distance that is different from said first distance, said second distance and said third distance.

8. A method of fabricating an integrated circuit structure, said method comprising:
forming a polysilicon layer above a semiconductor layer;
forming a first mandrel and a second mandrel in said polysilicon layer, said first mandrel and said second mandrel being approximately equal in size;
performing an oxidation process to form oxide sidewalls on said second mandrel and not on said first mandrel;
forming first sidewall spacers adjacent to said first mandrel and second sidewall spacers adjacent to said oxide sidewalls of said second mandrel; and
transferring, into said semiconductor layer, images of said first sidewall spacers to form a pair of first semiconductor fins and also combined images of said second sidewall spacers and said oxide sidewalls to form a pair of second semiconductor fins, wherein each of said first semiconductor fins in said pair of said first semiconductor fins have a first width and are separated by a first distance and wherein each of said second semiconductor fins in said pair of said second semiconductor fins have a second width and are separated by a second distance, and
wherein, due to said oxide sidewalls, said second width is greater than said first width and said second distance is less than said first distance.

9. The method of claim 8, further comprising, masking said first mandrel to prevent formation of oxide sidewalls on said first mandrel during said oxidation process.

10. The method of claim 8, further comprising, before said transferring of said images and said combined images, selectively removing said first mandrel and said second mandrel such that said first and second sidewall spacers and said oxide sidewalls remain above said semiconductor layer.

11. The method of claim 8, further comprising:
forming an oxidation-enhancing portion of said polysilicon layer;
forming a third mandrel in said oxidation-enhancing portion of said polysilicon layer such that during said oxidation process additional oxide sidewalls are formed on said third mandrel that are thicker than said oxide sidewalls of said second mandrel;
forming third sidewall spacers adjacent to said additional oxide sidewalls of said third mandrel; and
transferring combined images of said third sidewall spacers and said additional oxide sidewalls of said third mandrel into said semiconductor layer to form a pair of third semiconductor fins, each of said third semiconductor fins in said pair of said third semiconductor fins having a third width that is greater than said second width and further being separated by a third distance that is less than said second distance.

12. The method of claim 11, wherein said forming of said oxidation-enhancing portion of said polysilicon layer comprises implanting said oxidation-enhancing portion of said polysilicon layer with boron.

13. The method of claim 8, further comprising:
forming an oxidation-inhibiting portion of said polysilicon layer;
forming a fourth mandrel in said oxidation-inhibiting portion of said polysilicon layer such that during said oxidation process additional oxide sidewalls are formed on said fourth mandrel that are thinner than said oxide sidewalls of said second mandrel;
forming fourth sidewall spacers adjacent to said additional oxide sidewalls of said fourth mandrel; and
transferring combined images of said fourth sidewall spacers and said additional oxide sidewalls of said fourth mandrel into said semiconductor layer to form a pair of fourth semiconductor fins, each of said fourth semiconductor fins in said pair of said fourth semiconductor fins having a fourth width that is less than said second width and further being separated by a fourth distance that is greater than said second distance.

14. The method of claim 13, wherein said forming of said oxidation-inhibiting portion of said polysilicon layer comprises implanting said oxidation-inhibiting portion of said polysilicon layer with nitrogen.

15. A method of fabricating an integrated circuit structure, said method comprising:
   forming a polysilicon layer above a semiconductor layer;
   forming a first mandrel and a second mandrel in said polysilicon layer, said first mandrel and said second mandrel being approximately equal in size;
   forming a mask on said first mandrel;
   performing an oxidation process to form oxide sidewalls on said second mandrel and not on said first mandrel;
   removing said mask;
   forming first sidewall spacers adjacent to said first mandrel and second sidewall spacers adjacent to said oxide sidewalls of said second mandrel; and
   transferring, into said semiconductor layer, images of said first sidewall spacers to form a pair of first semiconductor fins and also combined images of said second sidewall spacers and said oxide sidewalls to form a pair of second semiconductor fins, wherein each of said first semiconductor fins in said pair of said first semiconductor fins have a first width and are separated by a first distance and wherein each of said second semiconductor fins in said pair of said second semiconductor fins have a second width and are separated by a second distance, and
   wherein, due to said oxide sidewalls, said second width is greater than said first width and said second distance is less than said first distance.

16. The method of claim 15, further comprising, before said transferring of said images and said combined images, selectively removing said first mandrel and said second mandrel such that said first sidewall spacers, said second sidewall spacers and said oxide sidewalls remain above said semiconductor layer.

17. The method of claim 15, further comprising:
   forming an oxidation-enhancing portion of said polysilicon layer;
   forming a third mandrel in said oxidation-enhancing portion of said polysilicon layer such that during said oxidation process additional oxide sidewalls are formed on said third mandrel that are thicker than said oxide sidewalls of said second mandrel;
   forming third sidewall spacers adjacent to said third mandrel; and
   transferring combined images of said third sidewall spacers and said additional oxide sidewalls of said third mandrel into said semiconductor layer to form a pair of third semiconductor fins, each of said third semiconductor fins in said pair of said third semiconductor fins having a third width that is greater than said second width and further being separated by a third distance that is less than said second distance.

18. The method of claim 17, wherein said forming of said oxidation-enhancing portion of said polysilicon layer comprises implanting said portion of said polysilicon layer with boron.

19. The method of claim 15, further comprising:
   forming an oxidation-inhibiting portion of said polysilicon layer;
   forming a fourth mandrel in said oxidation-inhibiting portion of said polysilicon layer such that during said oxidation process additional oxide sidewalls are formed on said fourth mandrel that are thinner than said oxide sidewalls of said second mandrel;
   forming fourth sidewall spacers adjacent to said fourth mandrel; and
   transferring combined images of said fourth sidewall spacers and said additional oxide sidewalls of said fourth mandrel into said semiconductor layer to form a pair of fourth semiconductor fins, each of said fourth semiconductor fins in said pair of said fourth semiconductor fins having a fourth width that is less than said second width and further being separated by a fourth distance that is greater than said second distance.

* * * * *